United States Patent
Kawabata

(10) Patent No.: US 6,600,688 B2
(45) Date of Patent: Jul. 29, 2003

(54) SEMICONDUCTOR MEMORY AND METHOD OF OPERATING THE SAME

(75) Inventor: Kuninori Kawabata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/964,508

(22) Filed: Sep. 28, 2001

(65) Prior Publication Data

US 2002/0097622 A1 Jul. 25, 2002

(30) Foreign Application Priority Data

Jan. 19, 2001 (JP) .................................. 2001-012043

(51) Int. Cl.[7] .................................................. G11C 7/00
(52) U.S. Cl. .................... 365/205; 365/189.01; 365/233
(58) Field of Search ................................ 365/208, 205, 365/191, 233, 230.03, 189.01, 230.01

(56) References Cited

U.S. PATENT DOCUMENTS 6,246,614 B1 * 6/2001 Ooishi .......................... 365/191
6,314,028 B1 * 11/2001 Kono ........................... 365/189.09
6,418,067 B1 * 7/2002 Watanabe et al. .......... 365/200

\* cited by examiner

*Primary Examiner*—Hoai Ho
*Assistant Examiner*—Gene N. Auduong
(74) *Attorney, Agent, or Firm*—Arent Fox Kintner Plotkin & Kahn, PLLC

(57) ABSTRACT

A semiconductor memory comprises a sense amplifier for amplifying a signal quantity of data transmitted to the bit line. The sense amplifier includes a transistor for electrically connecting, to the bit line, an input/output node of data which is read from/written in the memory cell, and for transmitting the data. The transistor is operated not only during data amplification of the sense amplifier but also in advance prior to the data amplification. Along with the operation of the transistor, a voltage of the bit line is changed by a coupling capacitance of the transistor and the bit line. Namely, the voltage of the bit line is shifted before the data held in the memory cell is transmitted to the bit line. Thus, it is possible to improve read margins of read data without forming a dedicated capacitance. As a result, the size of a chip can be decreased.

16 Claims, 11 Drawing Sheets

SEMICONDUCTOR MEMORY AND METHOD OF OPERATING THE SAME

BACKGROUND OF THE INVENTION

1. Field of the Invention

The present invention relates to a semiconductor memory including a sense amplifier and, more particularly, to a technology for securely reading out data which is written in a memory cell.

2. Description of the Related Art

In a semiconductor memory such as DRAM, data (charge) which is written in a memory cell leaks in a substrate and the like and disappears over time. Hence, the DRAM, for example, carries out refresh operation by rewriting the data in the memory cell at regular intervals in order to compensate a decrease in an amount of the charge in the memory cell.

In the DRAM, read operation and writing operation are generally carried out by using two bit lines (bit line pair). In the read operation, for example, reference voltage is first supplied to the bit line pair (precharge operation). Next, the data (storage charge) which is held in the memory cell is transmitted to one bit line. The storage charge in the memory cell is shared according to an amount ratio between the memory cell and the bit line, whereby voltage of one bit line changes. The voltage is compared with voltage of the other bit line (reference voltage), and "H data" or "L data" is read out.

Supposing that a state in which the charge is accumulated in the memory cell is "H state" and a state in which the charge is extracted from the memory cell is "L state", the memory cell in the H state changes to the L state over time, as described above. For this reason, a difference between the voltage of one bit line to which the charge in the H state is transmitted and the voltage of the other bit line (reference voltage) decreases as time passes. Meanwhile, the voltage of one bit line to which the charge in the L state is transmitted is grounding voltage in general, and hence a difference between this voltage and the voltage of the other bit line (reference voltage) does not change even after the passage of time. Therefore, a read margin in the H state is smaller than a read margin in the L state. In other words, the memory cell in the H state is difficult to read out as compared with the memory cell in the L state.

Recently, a sense amplifier with improved read margin in the H state has been developed in order to eliminate the disadvantage like the above. In this sense amplifier, the voltage of one of the bit lines out of the bit line pair is forced to change by using a coupling capacitance which is connected to the bit line, immediately before the accumulated charge of the memory cell is transmitted to the bit line.

Since operating voltage of the semiconductor memory such as the DRAM has been decreased, it has been difficult to keep an enough voltage difference between the bit line pair and to operate the sense amplifier without fail. For this reason, a method of increasing the voltage difference between the bit line pair in the read operation by using the coupling capacitance which is connected to the bit line is indispensable to the recent DRAM.

FIG. 1 shows a principle part of DRAM to which this kind of sense amplifier is applied.

A sense amplifier 10 is connected to a bit line pair BLT, BLC. The bit line pair BLT, BLC are connected to memory cell arrays 14 via isolation gates 12. The isolation gates 12 on the left side of the drawing are controlled by a bit line control signal BTLP. The isolation gates 12 on the right side of the drawing are controlled by a bit line control signal BTRP. In the read/write operation, one of the memory cell arrays 14 on both sides of the drawing is connected to the sense amplifier 10 by the bit line control signals BTLP, BTRP.

The memory cell array 14 includes a plurality of memory cells MC. Each of the memory cells MC consists of a capacitor for storing the data and a transfer transistor for connecting the capacitor to the bit line BLT (or BLC). In this example, a gate of the transfer transistor of the memory cell MC which is connected to the bit line BLT receives a word line signal WLT. A gate of the transfer transistor of the memory cell MC which is connected to the bit line BLC receives a word line signal WLC.

The sense amplifier 10 includes a latch 10a, capacitances 10b, 10c made of nMOS transistors, write switches 10d, 10e and read switches 10f, 10g. The latch 10a consists of two of CMOS inverters with these inputs and outputs connected to each other. The latch 10a is activated or inactivated according to a sense amplifier activating signal which is not shown. A source and a drain of the capacitance 10b are connected to the bit line BLT and a control signal BLPLTN is received at its gate. A source and a drain of the capacitance 10c are connected to the bit line BLC and a control signal BLPLCN is received at its gate.

Either source or drain of the write switch 10d is connected to the bit line BLT and the other of the source or drain is connected to an input/output node ND01 (data bus). A write control signal WSELP is received at its gate. Either source or drain of the write switch 10e is connected to the bit line BLC and the other of the source or drain is connected to an input/output node ND02 (data bus). The write control signal WSELP is received at its gate.

Either source or drain of the read switch 10f receives a read control signal RDRVN, the other of the source or drain is connected to an input/output node ND03 (data bus) and its gate is connected to the bit line BLT. Either source or drain of the read switch 10g receives the read control signal RDRVN, the other of the source or drain is connected to an input/output node ND04 (data bus) and its gate is directly connected to the bit line BLC.

In the sense amplifier 10, currents passing through the read switches 10f, 10g vary according to the voltage difference between the bit line pair BLT, BLC. Voltages (amplification voltage) are generated in the input/output nodes ND03, ND04 according to the difference of the current, and the generated voltage is transmitted to a read amplifier and the like. Namely, the read switch 10f (or 10g) has a function of amplifying read data which is transmitted to the bit line BLT (or BLC). This kind of circuit system is generally referred to as a direct sense system. The sense amplifier of the direct sense system does not connect the bit lines BLT, BLC and column switches 16c, 16d directly. For this reason, the voltages of the bit lines BLT, BLC do not change by the operations of the column switches 16c, 16d. That is, even when a column selecting signal is activated before the data which are transmitted from the memory cell MC to the bit lines BLT, BLC are fully amplified, the read operation is carried out properly. Therefore, it is suitable for high speed operation.

The input/output node ND01 is connected to a write data line WDT via a column switch 16a. The input/output node ND02 is connected to a write data line WDC via a column switch 16b. The input/output node ND03 is connected to a read data line RDT via the column switch 16c. The input/output node ND04 is connected to a read data line RDC via the column switch 16d. Gates of the column switches 16a to 16d receive a column selecting signal CSLP. The write data lines WDT, WDC are connected to a write amplifier (not shown) which receives write data from input/output terminals. The read data lines RDT, RDC are connected to a read amplifier (not shown) which outputs read data to the input/output terminals.

FIG. 2 shows an example of the operation of the aforementioned sense amplifier 10. In this example, the read data or the write data is transmitted to the bit line BLT. The bit line BLC (reference) acts as a line for supplying the reference voltage.

(A) Read Cycle

First, the memory cell array 14 on the left side of FIG. 1 is selected according to the supply of a row address signal, and the bit line control signal BTRP is inactivated (low level) (FIG. 2(a)). The not-shown bit line control signal BTRP is activated, and the memory cell array 14 and the bit lines BLT, BLC are connected. The voltages of the bit lines BLT, BLC are turned to the reference voltages in advance by the precharge operation (FIG. 2(b)).

Before the word line signal WLT is activated, the control signal BLPLCN is changed from a high level to a low level (kick operation). The control signal BLPLTN is maintained at the low level during the read operation. The voltage of the bit line BLC decreases by the action of the coupling capacitance of the capacitance 10c as the control signal BLPLCN changes (FIG. 2(c)).

Next, the word line signal WLT is activated according to the row address signal. It should be mentioned that activation levels of the word line signals WLT, WLC and the bit line control signals BTLP, BTRP are set to become higher than high level voltages of other signals (boost voltage). The transfer transistor of the memory cell MC is turned on by the activation of the word line signal WLT. Data held in the memory cell MC (in this example, in the H state) is transmitted to the bit line BLT, and the voltage of the bit line BLT increases (FIG. 2(d)). Incidentally, among the waveforms of the bit line BLT, the broken line which shifts toward the low level side shows when the memory cell MC maintaining the L state is read out.

The capacitance 10b is designed so that the voltage difference between the bit line pair BLT, BLC after the activation of the word line signal WLT becomes almost the same in the H state and in the L state by, for example, the aforementioned kick operation (FIG. 2(e)). Being thus designed, the read margin in the H state improves as compared with the case without the kick operation (FIG. 2(f)).

Thereafter, the latch 10a is activated, and the voltage difference between the bit line pair BLT, BLC increases. The read control signal RDRVN is activated in synchronization with the activation of the latch 10a (low level), and logic levels of the nodes ND03, ND04 and logic levels of the bit lines BLT, BLC are opposite to each other.

Next, the column selecting signal CSLP is activated (FIG. 2(g)), and voltages of the nodes ND03, ND04 are transmitted to the read data lines RDT, RDC, respectively. Thereafter, the column selecting signal CSLP and the word line signal WLT are inactivated (FIG. 2(h)), whereby the latch 10a is inactivated and an amplification period is complete.

Thereafter, the control signal BLPLCN and the bit line control signal BTRP are changed to the high levels. The bit lines BLT, BLC are equalized to each other, the read control signal RDRVN is inactivated (high level) and the read switches 10f, 10g are inactivated so that the read operation is complete.

(B) Write Cycle

When a word line is selected, data in the memory cells which are connected to the same word line are respectively transmitted to the bit line. In the write operation, data in the memory cells into which the data are not written are also transmitted to the bit line. In order to hold these data in the memory cells, rewrite operation (refresh operation) is necessary. Hence, the write operation of the memory cell into which the data is written is shown on the upper side of the drawing, and the rewrite operation of the memory cell into which the data is not written is shown on the lower side of the drawing.

In the write operation, the bit line control signal BTRP is inactivated (low level), similarly to the aforementioned read cycle (FIG. 2(i)). Next, the control signal BLPLCN is changed from the high level to the low level before the word line signal WLT is activated (kick operation). The voltage of the bit line BLC decreases by the coupling capacitance of the capacitance 10c as the control signal BLPLCN changes (FIG. 2(j)).

The word line signal WLT is activated and the transfer transistor of the memory cell MC is turned on. Data held in the memory cell MC (in this example, in the H state) is transmitted to the bit line BLT, and the voltage of the bit line BLT increases (FIG. 2(k)). The latch 10a is activated and the voltage difference between the bit line pair BLT, BLC increases. The write control signal WSELP and the column selecting signal CSLP are activated sequentially (FIG. 2(l)), the write data which are transmitted to the write data lines WDT, WDC are transmitted to the bit lines BLT, BLC via the nodes ND01, ND02, and the levels of the bit lines BLT, BLC are inverted (FIG. 2(m)).

Next, the column selecting signal CSLP and the write control signal WSELP are inactivated sequentially. The write data is amplified substantially by the latch 10a and written in the memory cell MC and thereafter, the word line signal WLT is inactivated (FIG. 2(n)). Thereafter, the control signal BLPLCN is changed to the high level. The bit line control signal BTRP is activated and the bit lines BLT, BLC are equalized to each other so that the write operation is complete.

In the rewrite operation, timings of the signals to be supplied to the sense amplifier 10 are the same as those in the above-described write operation, except for the column selecting signal CSLP. In the rewrite operation, the column selecting signal CSLP is not activated, and hence the data transmitted from the memory cell MC is amplified as it is by the latch 10a to be written in the memory cell MC again. Therefore, waveforms of the bit lines BLT, BLC are the same as those in the read cycle. As a result, it is also possible to improve the read margin of the memory cell MC in the H state in the rewrite operation. In other words, the amplified data is securely rewritten in the memory cell MC maintaining the H state.

FIG. 3 shows another example of the operation of the aforementioned sense amplifier 10. In this example, the read data or the write data is also transmitted to the bit line BLT. The bit line BLC (reference) acts as the line for supplying the reference voltage. The control signals BLPLTN, BLPLCN are usually maintained at the low levels, and one of the control signals is changed to the high level during the operation of the sense amplifier. Detailed explanations about the waveforms with the same timings as those in FIG. 2 are omitted.

(A) Read Cycle

First, the bit line control signal BTRP is inactivated and thereafter, the control signal BLPLTN is changed from the low level to the high level before the word line signal WLT is activated (kick operation). The control signal BLPLCN is maintained at the low level during the read operation. The voltage of the bit line BLT increases by the action of the coupling capacitance of the capacitance 10b as the control signal BLPLTN changes (FIG. 3(a)). Thereafter, the read operation is carried out similarly to FIG. 2.

Among the waveforms of the bit line BLT, the broken line which shifts toward the low level side shows when the memory cell MC maintaining the L state is read out. The capacitance 10c is designed so that the voltage difference between the bit line pair BLT, BLC after the activation of the word line signal WLT becomes almost the same in the H state and in the L state by, for example, the aforementioned kick operation (FIG. 3(b)). Therefore, the read margin in the H state improves as compared with the case without the kick operation (FIG. 3(c)).

(B) Write Cycle

The write operation is shown on the upper side of the drawing and the rewrite operation is shown on the lower side of the drawing. The write operation is the same as that in FIG. 2 except that the bit line BLT is subjected to the kick operation. In the rewrite operation, timings of the signals to be supplied to the sense amplifier 10 are the same as those in the write operation, except for the column selecting signal CSLP. Waveforms of the bit lines BLT, BLC are the same as those in the read cycle. As a result, it is also possible to improve the read margin of the memory cell MC in the H state in the rewrite operation.

However, in order to perform the aforesaid kick operation, it is necessary to prepare the capacitances 10b, 10c for each bit line pair BLT, BLC. Since the number of the bit lines is very large, the areas of the capacitances 10b, 10c are enormous. Further, wirings of the control signals BLPLTN, BLPLCN which control the capacitances 10b, 10c are lengthened. As a result, there are disadvantages that the size of a chip increases and the manufacturing cost increases.

SUMMARY OF THE INVENTION

It is an object of the present invention to decrease the size of a chip of a semiconductor memory having a sense amplifier.

It is another object of the present invention to decrease the number of elements of the sense amplifier and to operate the sense amplifier without fail.

According to one of the aspects of the present invention, a semiconductor memory comprises a bit line connected to a memory cell and a sense amplifier for amplifying a signal quantity of data transmitted to the bit line. The sense amplifier includes a transistor for electrically connecting, to the bit line, a data bus (an input/output node of data read from/written in the memory cell) to transmit the data. The transistor is operated not only during data amplification of the sense amplifier but also in advance prior to the data amplification. Along with the operation of the transistor, a voltage of the bit line is changed by a coupling capacitance of the transistor and the bit line. Namely, the voltage of the bit line is shifted before the data held in the memory cell is transmitted to the bit line (kick operation). Thus, it is possible to improve read margins of read data being either in an H state or in an L state without the formation of a capacitance dedicated for the kick operation. As a result, the size of the chip can be decreased.

According to another aspect of the present invention, the transistor connects one of its source or drain to the input/output node and the other of the source or drain to the bit line, respectively, and receives a write control signal which is activated during a write operation, at its gate. Namely, the voltage of the bit line can be changed by using the transistor which transmits write data to the bit line.

According to another aspect of the present invention, the transistor connects its drain to the input/output node and its gate to the bit line, and receives a read control signal which turns to a source voltage during a read operation, at its source. Namely, the voltage of the bit line can be changed by using the transistor which transmits the data read from the memory cell to the exterior.

According to another aspect of the present invention, a bit line pair is composed of two bit lines. The data and a reference voltage are respectively supplied to one of the bit lines and the other of the bit lines in accordance with an address signal supplied from the exterior. The transistors respectively connected to each of the bit lines of the bit line pair are controlled independently. Therefore, the voltage of at least one of the bit lines of the bit line pair can be easily changed by using the coupling capacitance of the transistors, without largely changing the circuits of the sense amplifier. As a result, potentials of the bit line pair can be differentiated in advance before the amplification of the sense amplifier, thereby improving the read margin.

According to another aspect of the present invention, the transistor connected to the bit line supplied with the reference voltage is operated in advance before the amplification. By this operation, a voltage of the bit line supplied with the reference voltage becomes lower than a voltage of the bit line supplied with the data. Thus, the voltages of the bit line pair can be differentiated in advance before the amplification of the sense amplifier.

According to another aspect of the present invention, the transistor connected to the bit line supplied with the data is operated in advance before the amplification. By this operation, the voltage of the bit line supplied with the data becomes higher than the voltage of the bit line supplied with the reference voltage. Thus, the voltages of the bit line pair can be differentiated in advance before the amplification of the sense amplifier.

According to another aspect of the present invention, the semiconductor memory further comprises a column switch for connecting the input/output node to the data line for inputting/outputting the data to/from the exterior. The column switch is operated in accordance with a column address signal for selecting the bit line. The transistor is operated in accordance with a row address signal for selecting a word line controlling the memory cell. The column switch inputs/outputs the data corresponding to the memory cell which is selected by the word line. Hence, the column switch is generally turned on after the amplification of the data is started. In other words, the column switch is off when the transistor is operated before the amplification. Therefore, it is possible to prevent the voltage of the bit line from being affected by a data line due to the operation of the transistor before the amplification. As a result, the data held in the memory cell can be read out more securely.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, the preferred embodiments of the present invention will be described with reference to the drawings.

Figure 4:
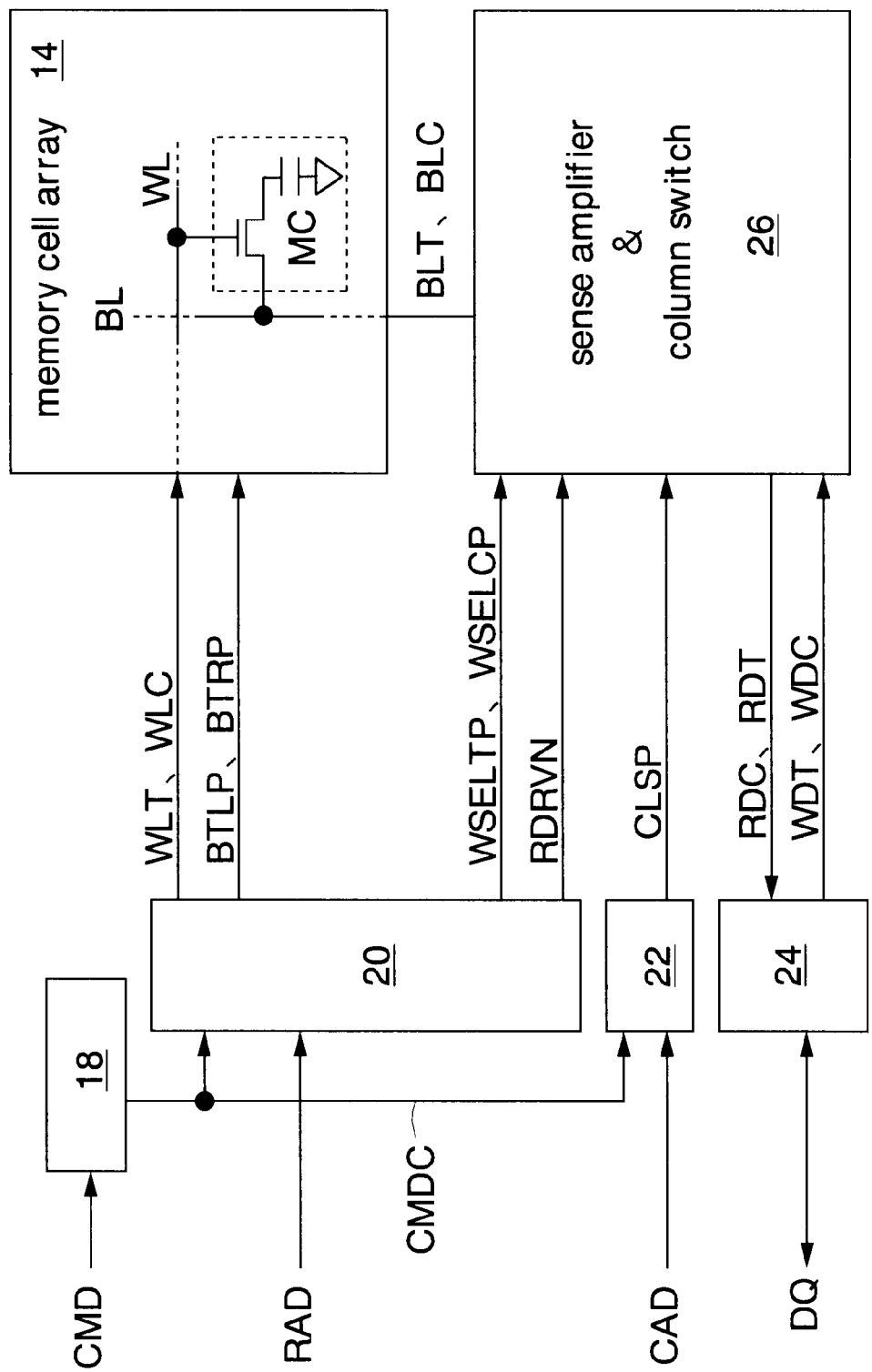
FIG. 4 is a block diagram showing a first embodiment of the present invention.

FIG. 4 shows a first embodiment of a semiconductor memory and a method of operating the semiconductor memory according to the present invention. Incidentally, the same numerals and symbols are given to the same circuits and signals as those explained in the Description of the Related Art, and detailed explanations thereof are omitted. As to each signal and each signal line which will be described below, a plurality of these exist in accordance with bit numbers of an address signal and a data input/output signal and the structure of a memory cell array.

This semiconductor memory is formed as DRAM by using a CMOS process on a silicon substrate. The DRAM includes a command decoder 18, a row control circuit 20 which corresponds to a row address signal RAD, a column control circuit 22 which corresponds to a column address signal CAD, a data input/output control circuit 24, a read/write control circuit 26 which includes a sense amplifier and a column switch, and memory cell arrays 14 each of which includes a plurality of memory cells MC.

Receiving a command signal CMD, the command decoder 18 decodes a command which is supplied from the exterior and outputs a command control signal CMDC. The row control circuit 20 receives the row address signal RAD and the command control signal CMDC and outputs word line signals WLT, WLC, bit line control signals BTLP, BTRP, write control signals WSELTP, WSELCP, and a read control signal RDRVN. The column control circuit 22 receives the column address signal CAD and the command control signal CMDC and outputs a column selecting signal CSLP.

Read data which are transmitted from the read/write control circuit 26 via read data lines RDC, RDT are outputted from the data input/output control circuit 24 as input/output data DQ. Write data which are received as the input/output data DQ are outputted from the data input/output control circuit 24 to the read/write control circuit 26 via write data lines WDT, WDC.

The read/write control circuit 26 receives the write control signals WSELTP, WSELCP, the read control signal RDRVN and the column selecting signal CSLP. The read/write control circuit 26 is connected to the memory cell array 14 via bit lines BLT, BLC.

Figure 5:
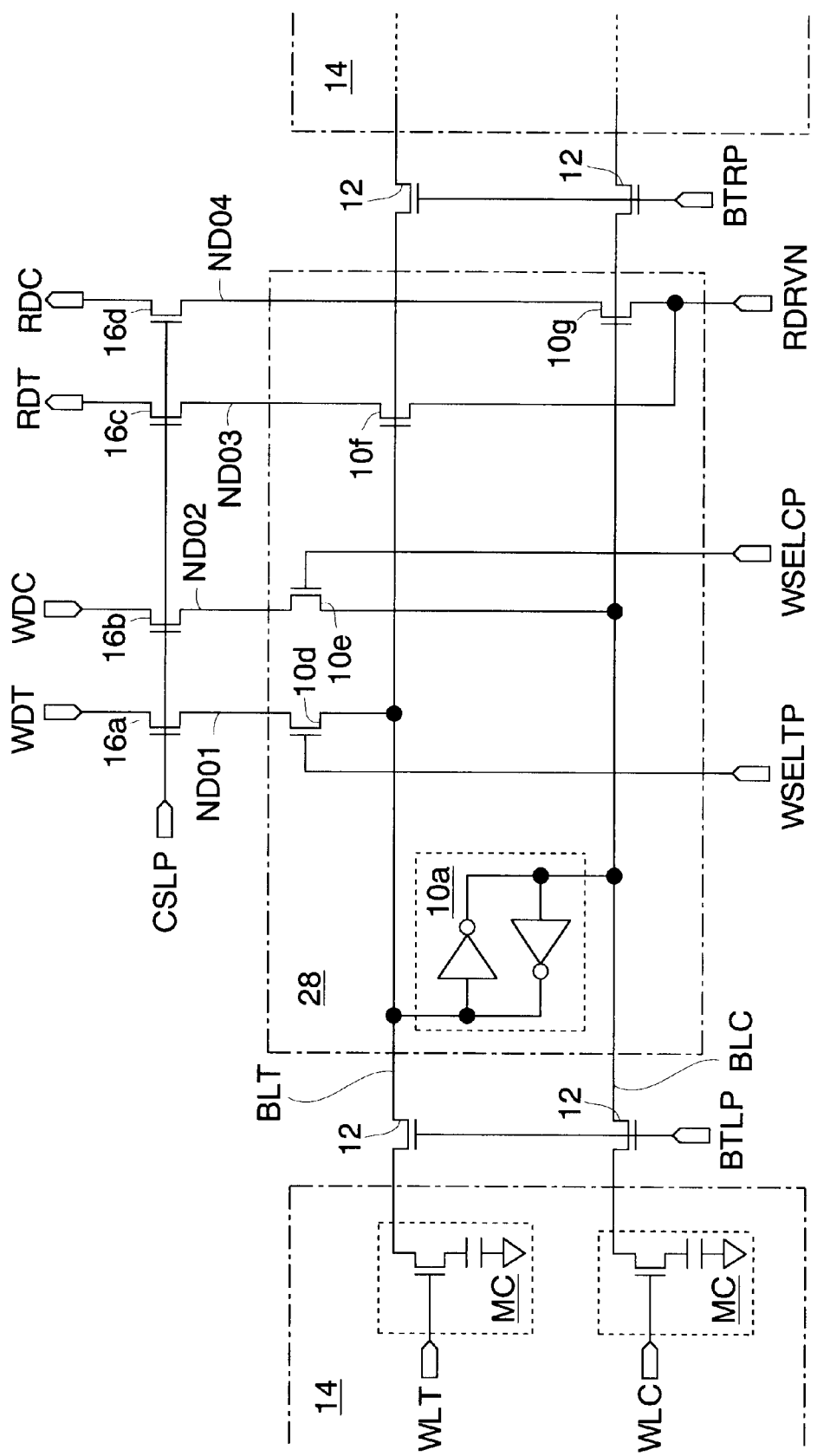
FIG. 5 is a circuit diagram showing a principle part of FIG. 4.

FIG. 5 shows a principle part of the read/write control circuit 26 and the memory cell array 14 in FIG. 4.

According to this embodiment, a sense amplifier 28 does not include the capacitances 10b, 10c which are formed in the conventional art and respective write switches 10d, 10d are controlled independently. Either source or drain of the write switch 10d is connected to the bit line BLT and the other of the source or drain is connected to an input/output node ND01 (data bus). The write control signal WSELTP is received at its gate. Either source or drain of the write switch 10e is connected to the bit line BLC and the other of the source or drain is connected to an input/output node ND02 (data bus). The write control signal WSELCP is received at its gate. The rest of the structure is the same as that in FIG. 1. Namely, the sense amplifier 28 adopts a direct sense system.

Figure 1:
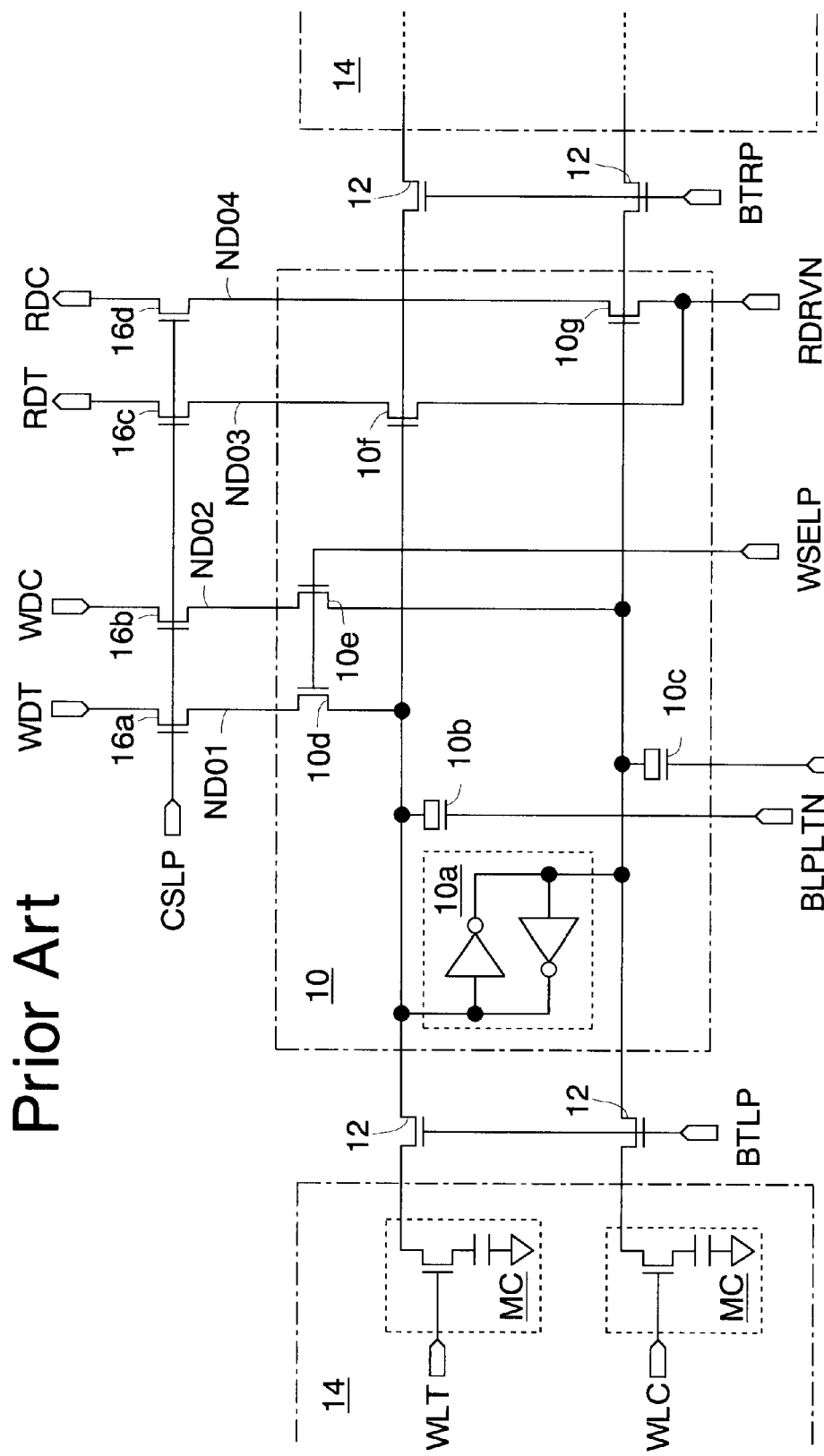
FIG. 1 is a circuit diagram showing a principle part of a conventional semiconductor memory.

According to this embodiment, pn junction capacitances and gate capacitances of the write switches 10d, 10e are used instead of the capacitances 10b, 10c which are shown in FIG. 1. Namely, kick operation is carried out by the action of a coupling capacitance of the write switches 10d, 10e. Since it is unnecessary to prepare the capacitances 10b, 10c for each of the bit lines BLT, BLC, the layout area of the sense amplifier 28 decreases substantially as compared with the conventional art. Although two of the write control signals WSELTP, WSELCP are necessary, it is possible to decrease the number of the signal lines by one as compared with the conventional art because the signals for controlling the kick operation (control signals BLPLTN, BLPLCN in FIG. 1) are unnecessary.

Figure 6:
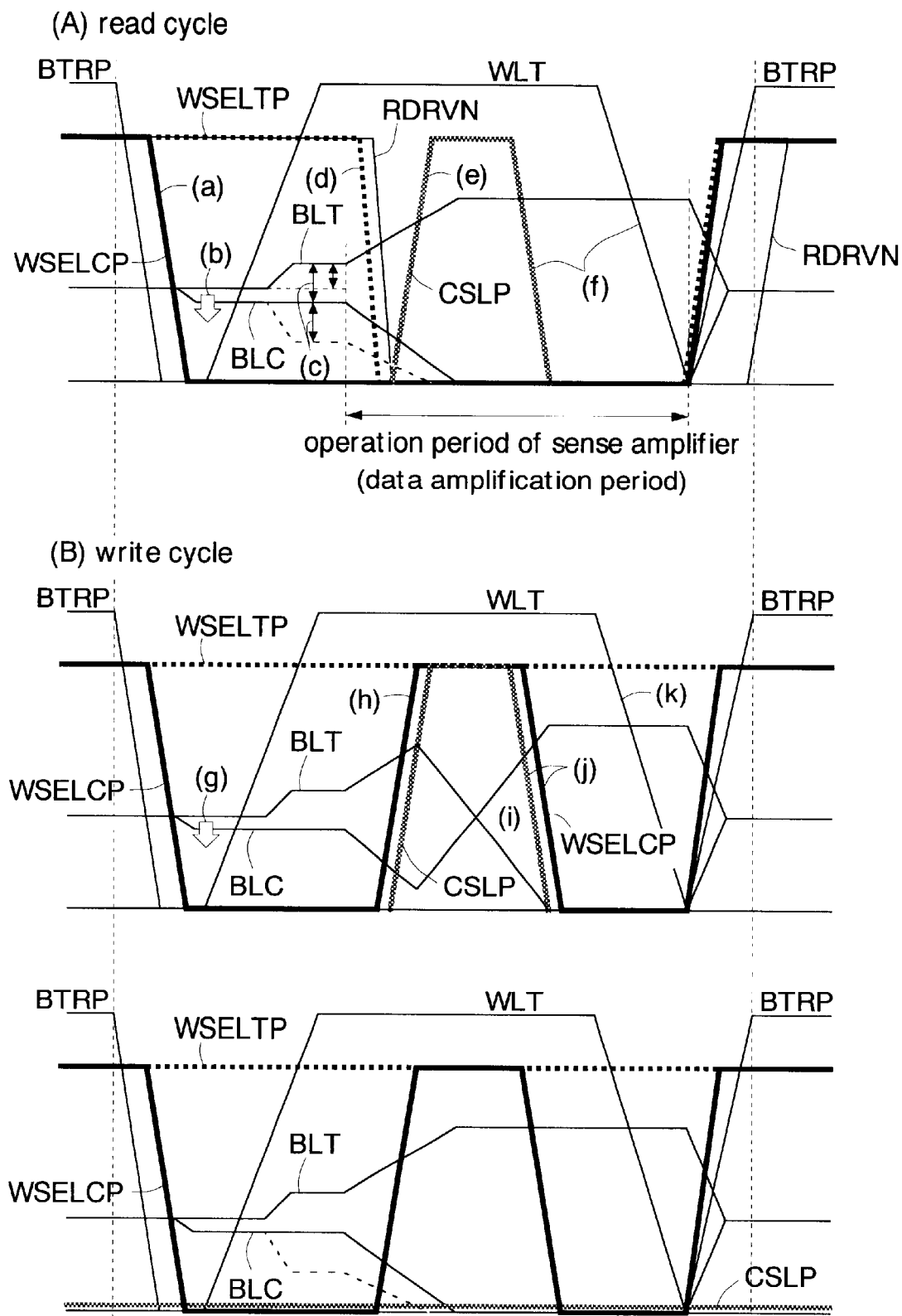
FIG. 6 is a timing chart showing an operation of a sense amplifier according to the first embodiment.

FIG. 6 shows an example of the operation of the aforementioned sense amplifier 28. Detailed explanations about the waveforms with the same timings as those in FIG. 1 are omitted. In this example, the read data or the write data is transmitted to the bit line BLT. The bit line BLC (reference) acts as a line for supplying reference voltage. The write control signals WSELTP, WSELCP are usually maintained at high levels. The write control signals WSELTP, WSELCP are sequentially changed to low levels during an operation period of the sense amplifier 28. During a period when the column selecting signal CSLP is inactivated (low level), the nodes ND01, ND02 are in high impedance states. Therefore, even though the write control signals WSELTP, WSELCP are at the high levels during this period, read operation and write operation are not affected thereby.

(A) Read Cycle

First, the bit line control signal BTRP is inactivated and thereafter, the write control signal WSELCP is changed to the low level before the word line signal WLT is activated (FIG. 6(a)). The voltage of the bit line BLC decreases by the action of the coupling capacitance of the write switch 10e as the write control signal WSELCP changes (kick operation, FIG. 6(b)).

It should be mentioned that the coupling capacitance of the write switch 10e is designed so that a voltage difference between the bit line pair BLT, BLC after the activation of the word line signal WLT becomes almost the same in an H state and in an L state by, for example, the kick operation (FIG. 6(c)). Being thus designed, it is possible to improve a read margin in the H state similarly to the conventional art, without the capacitances 10b, 10c which are shown in FIG. 1. Even when the coupling capacitance of the write switch 10e is the same as that of the conventional art, the read margin is improved because the voltage of the bit line BLC decreases by the kick operation.

Next, the word line signal WLT is activated, data held in the memory cell MC (in this example, in the H state) is transmitted to the bit line BLT, and the voltage of the bit line BLT increases. Among the waveforms of the bit line BLT, the broken line which shifts toward the low level side shows when the memory cell MC maintaining the L state is read out, similarly to FIG. 1.

The word line signal WLT is activated and thereafter, the write control signal WSELCP is changed to the low level before the column selecting signal CSLP is activated (FIG. 6(d)). A timing at which the write control signal WSELCP is changed preferably comes before the read control signal RDRVN is changed to the low level. Thereafter, a latch 10a is activated and the voltage difference between the bit line pair BLT, BLC increases.

Next, the read control signal RDRVN is changed to the low level in synchronization with activation of the latch 10a, and the read data are outputted to nodes ND03, ND04. Logic levels of the nodes ND03, ND04 and logic levels of the bit lines BLT, BLC are opposite to each other. Thereafter, the column selecting signal CSLP is activated (FIG. 6(e)), and the read data which are complementary to each other are outputted to the read data lines RDC, RDT.

The column selecting signal CSLP and the word line signal WLT are inactivated (FIG. 6(f)) and the latch 10a is inactivated so that an amplification period is complete. Thereafter, the write control signals WSELTP, WSELCP and the bit line control signal BTRP are changed to the high levels. The bit lines BLT, BLC are equalized to each other, the read control signal RDRVN is inactivated (high level), and read switches 10f, 10g are inactivated so that the read operation is complete.

(B) Write Cycle

In the write operation, the write control signal WSELTP corresponding to the bit line BLT to which the write data is transmitted is maintained at the high level at all times. Similarly to the aforementioned read cycle, the bit line control signal BTRP is inactivated (low level) and thereafter, the write control signal WSELCP is changed to the low level before the word line signal WLT is activated (kick operation). The voltage of the bit line BLC decreases by the coupling capacitance of the write switch 10e as the write control signal WSELCP changes (FIG. 6(g)).

The word line signal WLT is activated and thereafter, the write control signal WSELCP is changed to the high level before the column selecting signal CSLP is activated (FIG. 6 (h)). The column selecting signal CSLP is activated, and the write data which are transmitted to the write data lines WDT, WDC are transmitted to the bit lines BLT, BLC via the nodes ND01, ND02. In this example, the logic of the write data and the logic of the data held in the memory cell MC are opposite to each other. Therefore, the levels of the bit lines BLT, BLC are inverted (FIG. 6(i)).

After the write data is amplified to a predetermined level by the latch 10a, the column selecting signal CSLP and the write control signal WSELCP are inactivated sequentially (FIG. 6(j)). The write data is amplified enough by the latch 10a and written in the memory cell MC and thereafter, the word line signal WLT is inactivated (FIG. 6(k)). Thereafter, the write control signal WSELCP is changed to the high level again. The bit line control signal BTRP is activated and the bit lines BLT, BLC are equalized to each other so that the write operation is complete.

In rewrite operation, timings of the signals to be supplied to the sense amplifier 28 are the same as those in the above-described write operation, except for the column selecting signal CSLP. In the rewrite operation, the column selecting signal CSLP is not activated, and hence the data transmitted from the memory cell MC is amplified by the latch 10a to be written in the memory cell MC again. Therefore, waveforms of the bit lines BLT, BLC are the same as those in the read cycle. As a result, it is also possible to improve the read margin of the memory cell MC in the H state during the rewrite operation. In other words, the amplified data is securely rewritten in the memory cell MC maintaining the H state.

Thus, also in the write cycle, the write operation can be carried out normally and the data can be securely rewritten in the memory cell into which the data is not written by the kick operation.

Figure 2:
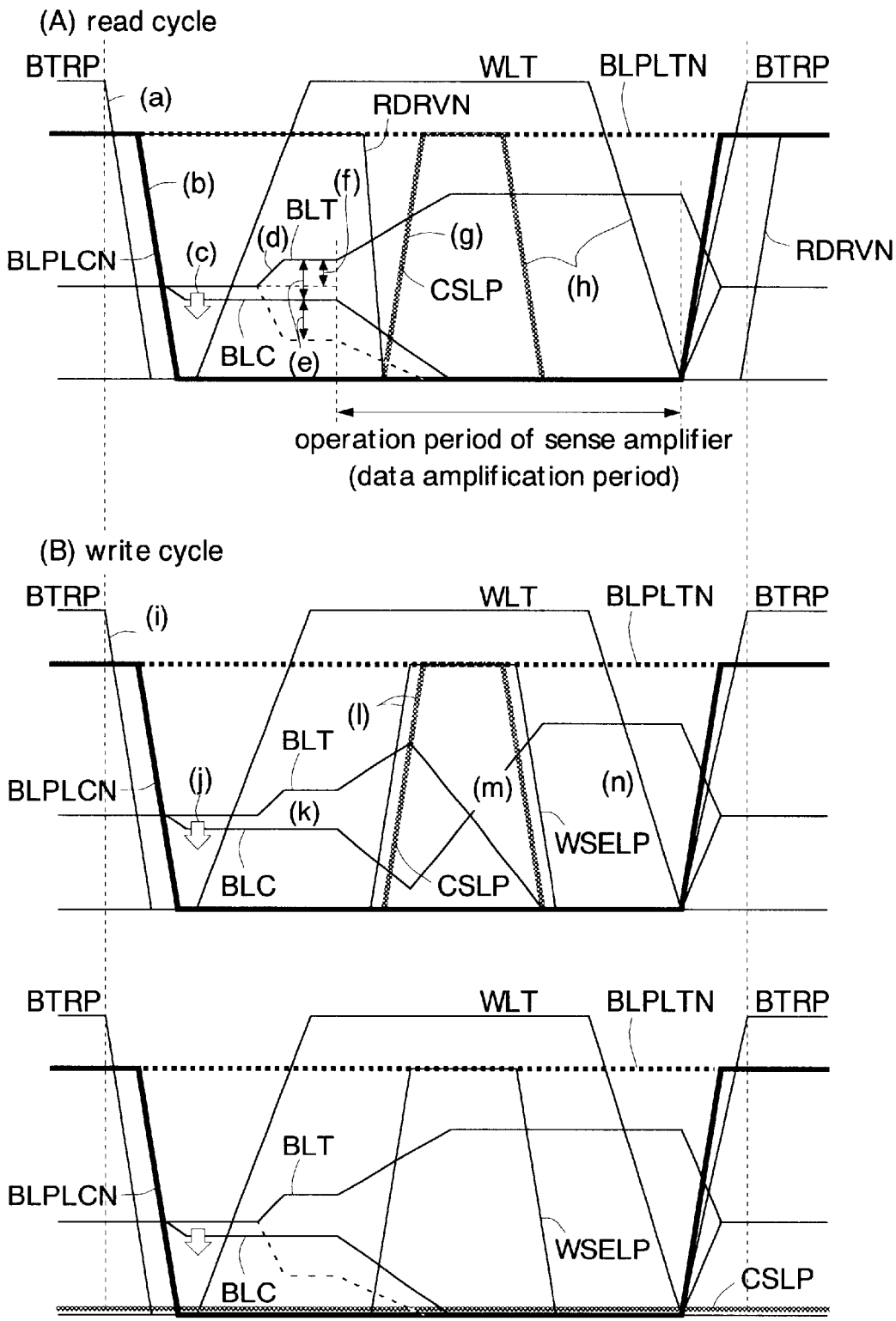
FIG. 2 is a timing chart showing an operation of a conventional sense amplifier.
Figure 3:
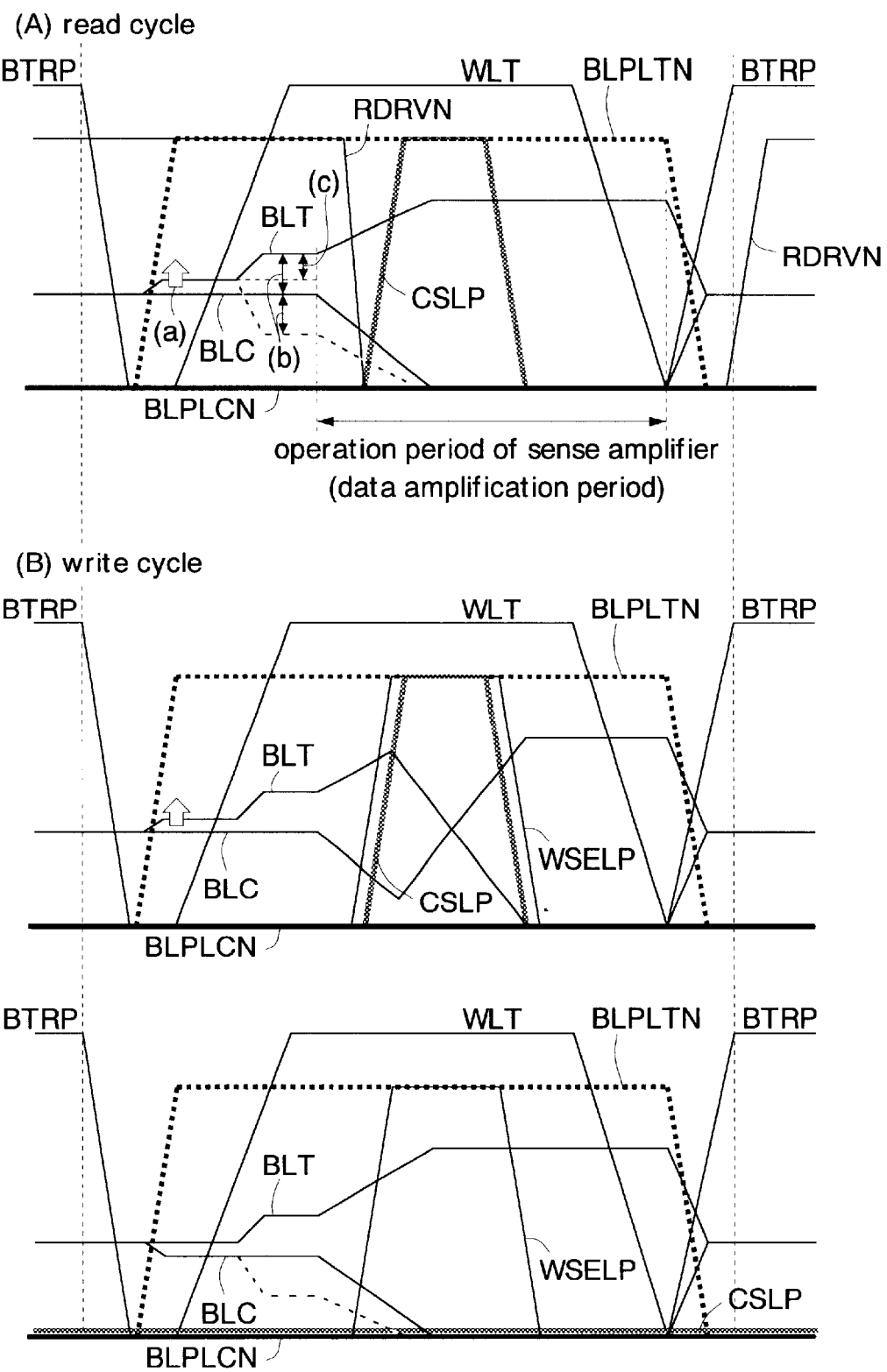
FIG. 3 is a timing chart showing another operation of the conventional sense amplifier.

In this embodiment as described above, the write switch 10e which is connected to the bit line BLC supplied with the reference voltage, among the write switches (transistors) for transmitting the write data to the bit lines, is operated in advance before the amplification of the sense amplifier 28, and the voltage of the bit line BLC is decreased by the coupling capacitance of the transistor and the bit line (kick operation). Thus, it is possible to improve the read margin of the read data in the H state without the formation of the capacitance dedicated for the kick operation. Since the conventional capacitances (capacitances 10b, 10c in FIG. 2) are unnecessary, the layout size of the sense amplifier 28 is decreased and the size of a chip can be decreased.

The write switches 10d, 10e which are respectively connected to the bit lines BLT, BLC of the bit line pair are controlled independently to carry out the kick operation. Thus, the voltage of one of the bit lines of the bit line pair can be easily changed by using the coupling capacitance of the write switches 10d, 10e, while hardly changing the circuit of the sense amplifier 28, compared with the conventional art. In concrete, it is suitable to supply the write control signals WSELTP, WSELCP which are different from each other to the gates of the write switches 10d, 10e.

Out of a column switch 16b and the write switch 10e which are connected in series, the write switch 10e is subjected to the kick operation so that the voltage of the bit line BLC is decreased. The column switch 16b which is activated in accordance with the column address signal is turned off in the kick operation of the write switch 10e. Hence, it is possible to prevent the voltage of the bit line BLC from being influenced by the write data line WDC due to the operation of the write switch 10e before the amplification. As the result, the data which is held in the memory cell can be read out more securely.

Figure 7:
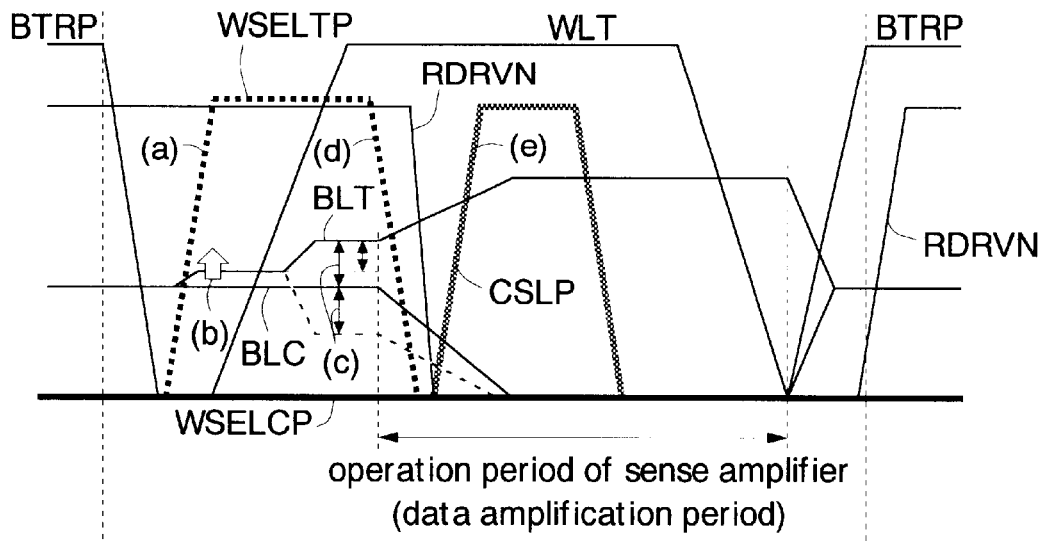
FIG. 7 is a timing chart showing an operation of a sense amplifier according to a second embodiment of the present invention.
Figure 7:
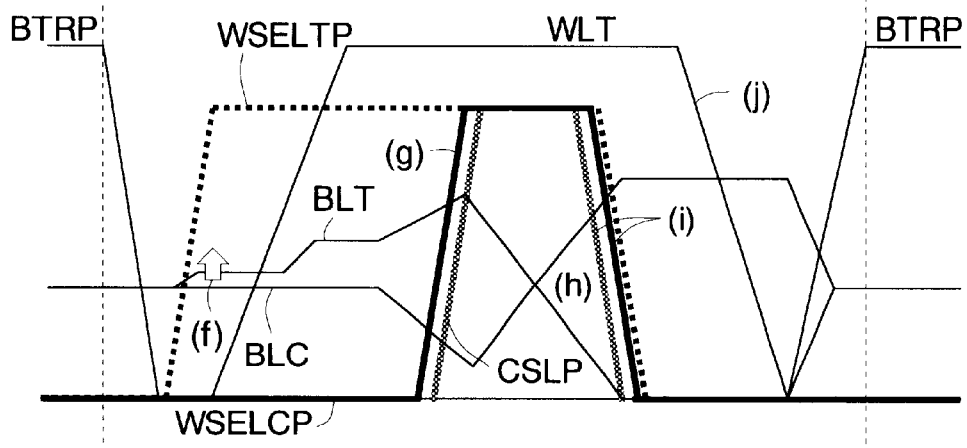
Figure 7:
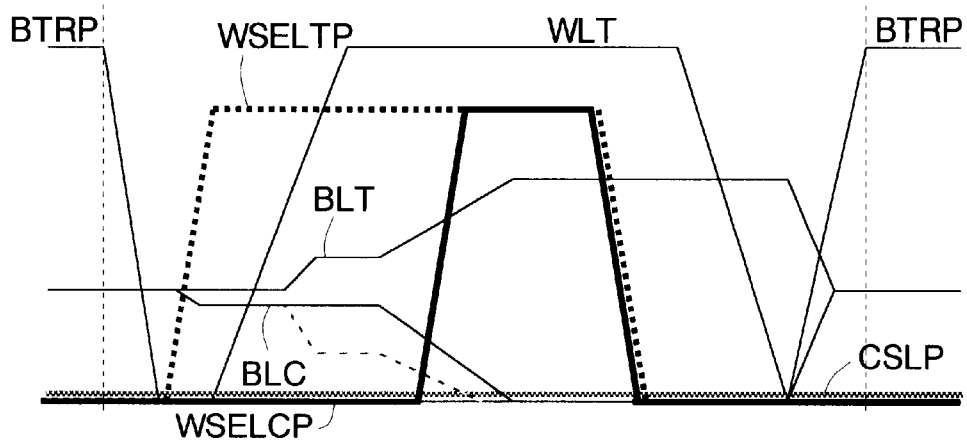

FIG. 7 shows the operation of a sense amplifier according to a second embodiment of the semiconductor memory and the method of operating the semiconductor memory of the present invention. Incidentally, the same numerals and symbols are given to the same circuits and signals as those explained in the Description of the Related Art and in the first embodiment, and detailed explanations thereof are omitted.

In this embodiment, generation timings of write control signals WSELTP, WSELCP are different from those in the first embodiment. The rest of the structure and the generation timings of signals are the same as those in the first embodiment. Namely, the overall structure of DRAM according to this embodiment is the same as that in the first embodiment, except for the row control circuit 20 shown in FIG. 4. A sense amplifier and circuits on the periphery thereof are the same as those in FIG. 5.

In this embodiment, the read data or the write data is also transmitted to a bit line BLT. A bit line BLC (reference) acts as a line for supplying the reference voltage. The write control signal WSELTP is usually maintained at the low level and changed to the high level in the kick operation, contrary to the first embodiment. Detailed explanations about waveforms with the same timings as those in FIG. 6 are omitted.

(A) Read Cycle

First, a bit line control signal BTRP is inactivated and thereafter, the write control signal WSELTP is changed to the high level before a word line signal WLT is activated (FIG. 7(a)). The voltage of the bit line BLT increases by the action of a coupling capacitance of a write switch 10d as the write control signal WSELTP changes (kick operation, FIG. 7(b)).

Similarly to the explanation of FIG. 6, the coupling capacitance of the write switch 10d is designed so that a voltage difference between the bit line pair BLT, BLC after the activation of the word line signal WLT becomes almost the same in an H state and in an L state by, for example, the aforementioned kick operation (FIG. 7(c)). Therefore, it is possible to improve a read margin in the H state similarly to the conventional art, without the capacitances 10b, 10c shown in FIG. 1. Even when the coupling capacitance of the write switch 10d is the same as that of the conventional art, the read margin is improved because the voltage of the bit line BLT increases by the kick operation.

Next, the word line signal WLT is activated, data held in a memory cell MC (in this example, in the H state) is transmitted to the bit line BLT, and the voltage of the bit line BLT increases further. The word line signal WLT is activated and thereafter, the write control signal WSELTP is changed to the low level before a column selecting signal CSLP is activated (FIG. 7(d)). A timing at which the write control signal WSELTP is changed preferably comes before a read control signal RDRVN is changed to the low level. Thereafter, a latch 10a is activated and the voltage difference between the bit line pair BLT, BLC increases. The read control signal RDRVN is changed to the low level, the column selecting signal CSLP is activated (FIG. 7(e)), and the read data which are complementary to each other are outputted to read data lines RDC, RDT.

Subsequently, similarly to FIG. 6, the column selecting signal CSLP, the word line signal WLT, the read control signal RDRVN and a bit line control signal BTRP are changed so that read operation is complete.

(B) Write Cycle

First, the bit line control signal BTRP is inactivated (low level) and thereafter, the write control signal WSELTP corresponding to the bit line BLT to which the write data is transmitted is changed to the high level before the word line signal WLT is activated (kick operation), similarly to the aforementioned read cycle. The voltage of the bit line BLT increases as the write control signal WSELTP changes (FIG. 7(f)).

The word line signal WLT is activated and thereafter, the write control signal WSELCP is changed to the high level before the column selecting signal CSLP is activated (FIG. 7(g)). The column selecting signal CSLP is activated, the write data which are transmitted to write data lines WDT, WDC are transmitted to the bit lines BLT, BLC via nodes ND01, ND02, and the levels of the bit lines BLT, BLC are inverted (FIG. 7(h)).

Next, the column selecting signal CSLP and the write control signals WSELTP, WSELCP are inactivated sequentially (FIG. 7(i)). The write data is amplified enough by the latch 10a and written in the memory cell MC and thereafter, the word line signal WLT is inactivated (FIG. 7(j)). Thereafter, the bit line control signal BTRP is activated and the bit lines BLT, BLC are equalized to each other so that write operation is complete.

In rewrite operation, timings of the signals to be supplied to a sense amplifier 28 are the same as those in the above-described write operation, except for the column selecting signal CSLP. Waveforms of the bit lines BLT, BLC are the same as those in the read cycle. As a result, it is also possible to improve the read margin of the memory cell MC in the H state in the rewrite operation. In other words, the amplified data is securely rewritten in the memory cell MC maintaining the H state.

As described above, the write control signals WSELTP, WSELCP are controlled independently and the bit line BLT to which the data is transmitted is subjected to the kick operation, whereby the data in the memory cell MC in the H state can be read out without fail in this embodiment.

The same effects as those in the aforementioned first embodiment can also be obtained in this embodiment.

Figure 8:
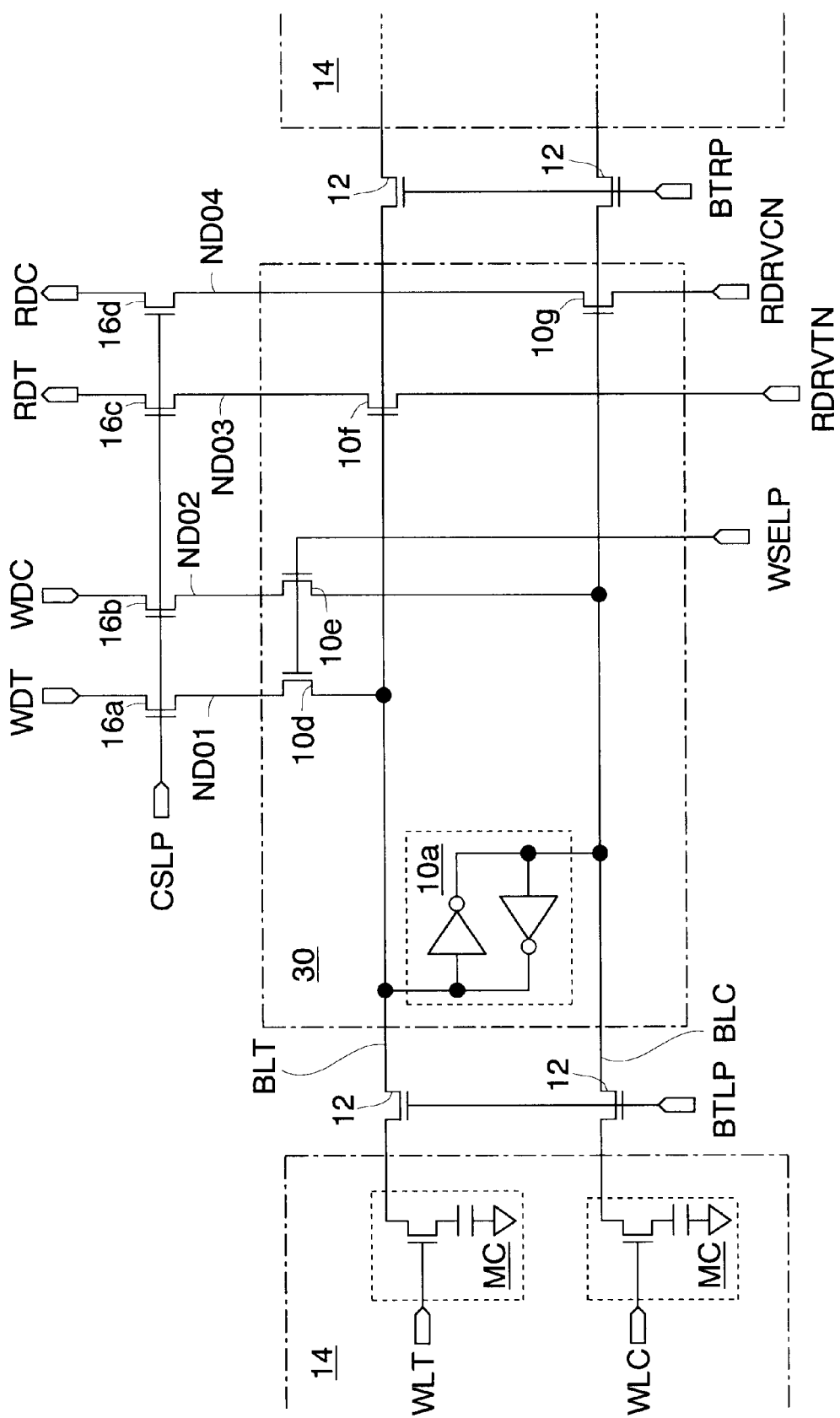
FIG. 8 is a circuit diagram showing a principle part according to a third embodiment of the present invention.

FIG. 8 shows a principle part of a read/write control circuit and a memory cell array according to a third embodiment of the semiconductor memory and the method of operating the semiconductor memory of the present invention. Incidentally, the same numerals and symbols are given to the same circuits and signals as those explained in the Description of the Related Art and in the first embodiment, and detailed explanations thereof are omitted.

The overall structure of DRAM according to this embodiment is the same as that in the first embodiment, except for the row control circuit 20 shown in FIG. 4. A row control circuit of this embodiment outputs a write control signal WSELP and read control signals RDRVTN, RDRVCN. Further, a sense amplifier 30 is different from the sense amplifier 28 of the first embodiment (FIG. 5). Write switches 10d, 10e of the sense amplifier 30 are controlled by the write control signal WSELP, and read switches 10f, 10g of the sense amplifier are controlled by the read control signals RDRVTN, RDRVCN, respectively. The rest of the structure is the same as that of FIG. 5.

Figure 9:
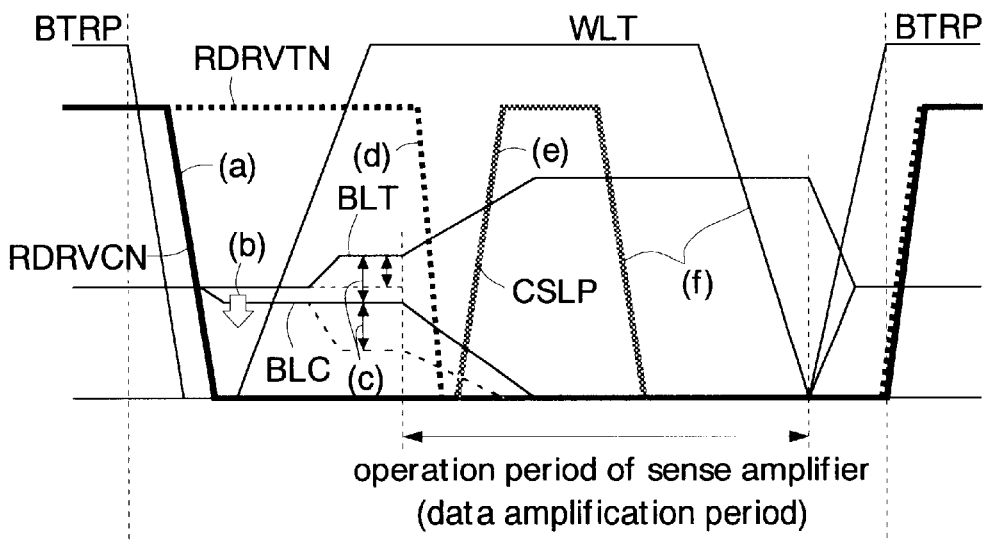
FIG. 9 is a timing chart showing an operation of a sense amplifier according to the third embodiment.
Figure 9:
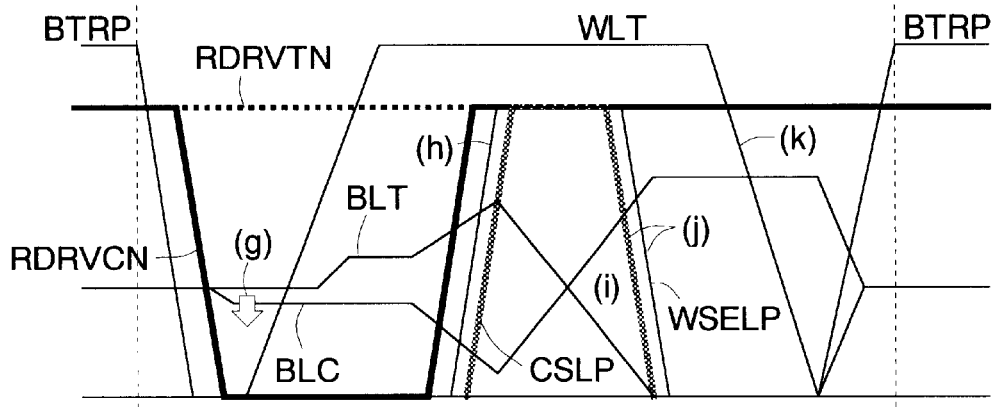
Figure 9:
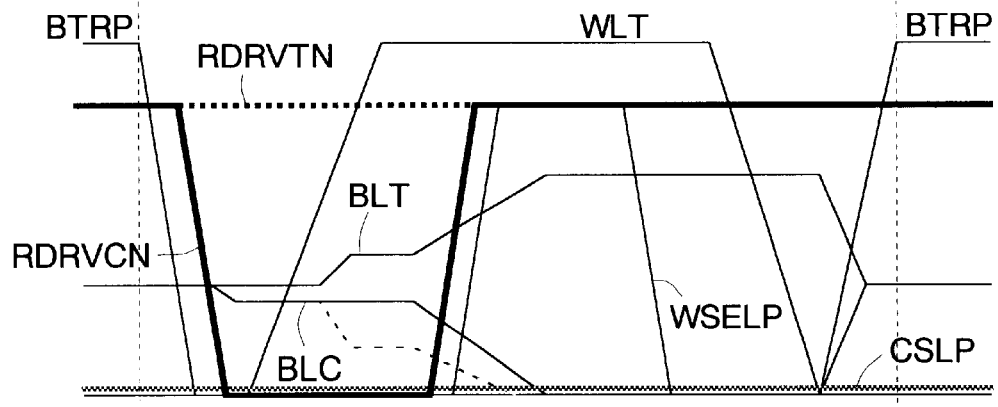

FIG. 9 shows an example of the operation of the aforementioned sense amplifier 30. Detailed explanations about the waveforms with the same timings as those in FIG. 6 are omitted. In this example, the read data or the write data is also transmitted to a bit line BLT. A bit line BLC (reference) acts as a line for supplying the reference voltage. The read control signals RDRVTN, RDRVCN are usually maintained at the high levels. The read control signals RDRVTN, RDRVCN are sequentially changed to the low levels during an operation period of the sense amplifier 30. During a period when a column selecting signal CSLP is inactivated (low level), nodes ND03, ND04 are in high impedance states. Therefore, even though the read control signals RDRVTN, RDRVCN are at the high levels during this period, read operation and write operation are not affected thereby.

(A) Read Cycle

First, a bit line control signal BTRP is inactivated and thereafter, the read control signal RDRVCN is changed to the low level before a word line signal WLT is activated (FIG. 9(a)). The voltage of the bit line BLC decreases by the action of a coupling capacitance of a read switch 10g as the read control signal RDRVCN changes (kick operation, FIG. 9(b)).

It should be mentioned that the coupling capacitance of the read switch 10g is designed so that a voltage difference between the bit line pair BLT, BLC after the activation of the word line signal WLT becomes almost the same in an H state and in an L state by, for example, the aforementioned kick operation (FIG. 9(c)).

Next, the word line signal WLT is activated, data held in a memory cell MC (in this example, in the H state) is transmitted to the bit line BLT, and the voltage of the bit line BLT increases. After the word line signal WLT is activated, the read control signal RDRVTN is changed to the low level (FIG. 9(d)), and the read data are outputted to the nodes ND03, ND04. The read control signal RDRVTN is changed to the low level and thereafter, the column selecting signal CSLP is activated (FIG. 9(e)), and the read data are outputted to read data lines RDC, RDT.

Thereafter, the column selecting signal CSLP and the word line signal WLT are inactivated (FIG. 9(f)) and a latch 10a is inactivated so that the amplification period is complete. The bit line control signal BTRP is changed to the high level, and the bit lines BLT, BLC are equalized to each other. The read control signals RDRVTN, RDRVCN are inactivated (high level), and the read switches 10f, 10g are inactivated so that the read operation is complete.

(B) Write Cycle

In the write operation, the read control signal RDRVTN corresponding to the bit line BLT to which the write data is transmitted is maintained at the high level at all times. Similarly to the aforementioned read cycle, the bit line control signal BTRP is inactivated (low level) and thereafter, the read control signal RDRVCN is changed to the low level before the word line signal WLT is activated (kick operation). The voltage of the bit line BLC decreases by coupling capacitance of the read switch 10g as the read control signal RDRVCN changes (FIG. 9(g)).

The word line signal WLT is activated and thereafter, the read control signal RDRVCN is changed to the high level before the column selecting signal CSLP is activated (FIG. 9(h)). The write control signal WSELP and the column selecting signal CSLP are activated sequentially, the write data which are transmitted to write data lines WDT, WDC are transmitted to the bit lines BLT, BLC via nodes ND01, ND02, and the levels of the bit lines BLT, BLC are inverted (FIG. 9(i)).

Next, the column selecting signal CSLP and the write control signal WSELP are inactivated sequentially (FIG. 9(j)) and the word line signal WLT is inactivated (FIG. 9(k)). Thereafter, the write control signal WSELCP is changed to the high level again. The bit line control signal BTRP is activated and the bit lines BLT, BLC are equalized to each other so that the write operation is complete.

In rewrite operation, timings of the signals to be supplied to the sense amplifier 30 are the same as those in the above-described write operation, except for the column selecting signal CSLP. In the rewrite operation, the column selecting signal CSLP is not activated, and hence the data which is transmitted from the memory cell MC is amplified by the latch 10a to be written in the memory cell MC again. Therefore, waveforms of the bit lines BLT, BLC are the same as those in the read cycle. As a result, it is also possible to improve the read margin of the memory cell MC in the H state in the rewrite operation, similarly to the above embodiments As described above, the read control signals RDRVTN, RDRVCN are controlled independently and the bit line BLT to which the data is transmitted is subjected to the kick operation, whereby the data in the memory cell MC in the H state can be read out without fail in this embodiment.

The same effects as those in the aforementioned first embodiment can also be obtained in this embodiment. Further, out of a column switch 16d and the read switch 10g which are connected in series, the read switch 10g is subjected to the kick operation in this embodiment so that the voltage of the bit line BLC is decreased. The column switch 16d which is activated in accordance with a column address signal is turned off in the kick operation of the read switch 10g. Hence, it is possible to prevent the voltage of the bit line BLC from being influenced by the read data line RDC due to the operation of the read switch 10g before the amplification. As the result, the data which is held in the memory cell can be read out more securely.

Figure 10:
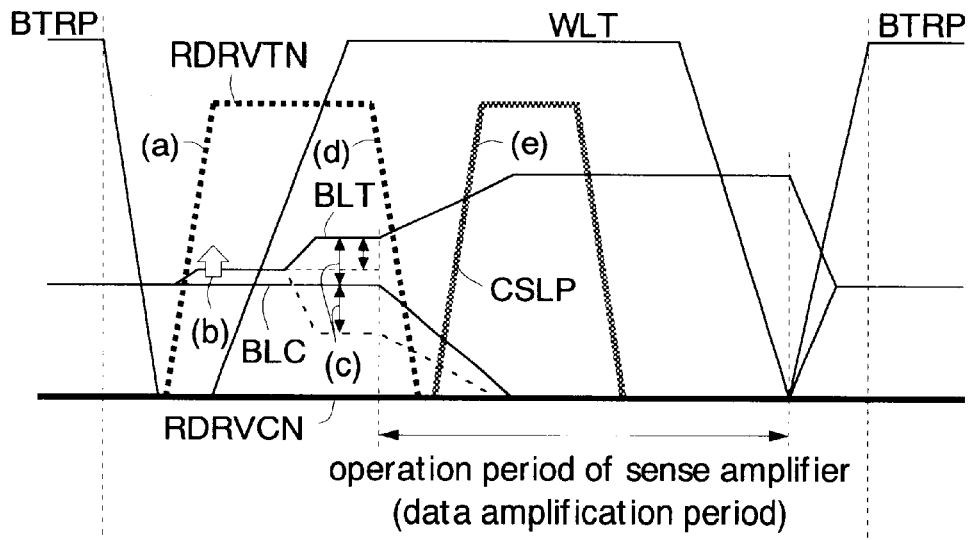
FIG. 10 is a timing chart showing an operation of a sense amplifier according to a fourth embodiment of the present invention.
Figure 10:
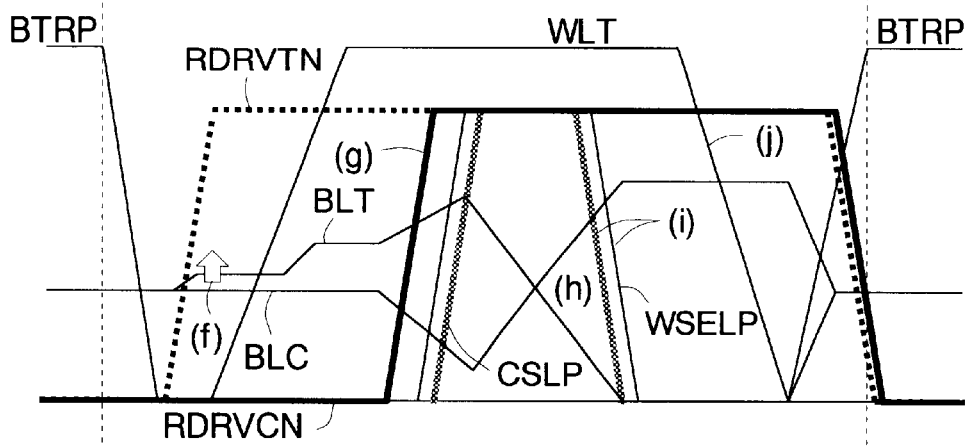
Figure 10:
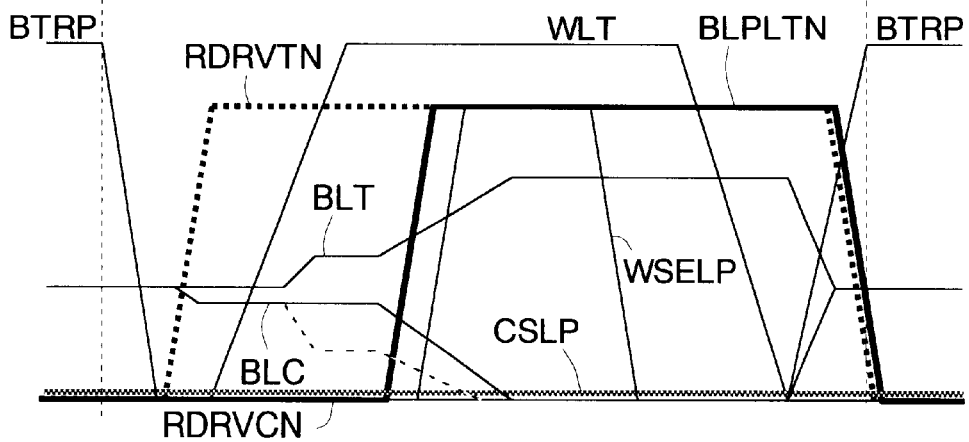

FIG. 10 shows the operation of a sense amplifier according to a fourth embodiment of the semiconductor memory and the method of operating the semiconductor memory of the present invention. Incidentally, the same numerals and symbols are given to the same circuits and signals as those explained in the Description of the Related Art and in the first and the third embodiments, and detailed explanations thereof are omitted.

In this embodiment, generation timings of read control signals RDRVTN, RDRVCN are different from those in the third embodiment. The rest of the structure and the generation timings of signals are the same as those in the third embodiment. Namely, the overall structure of DRAM according to this embodiment is the same as that in the third embodiment, except for a row control circuit. A sense amplifier and circuits on the periphery thereof are the same as those in FIG. 8.

In this embodiment, the read data or the write data is also transmitted to a bit line BLT. A bit line BLC (reference) acts as a line for supplying the reference voltage. The read control signal RDRVTN is usually maintained at the low level and changed to the high level in the kick operation. Detailed explanations about waveforms with the same timings as those in FIG. 9 are omitted.

(A) Read Cycle

First, a bit line control signal BTRP is inactivated and thereafter, the read control signal RDRVTN is changed to the high level before a word line signal WLT is activated (FIG. 10(a)). The voltage of the bit line BLT increases by the action of a coupling capacitance of a read switch 10f as the read control signal RDRVTN changes (kick operation, FIG. 10(b)).

Similarly to the explanation of FIG. 9, the coupling capacitance of the read switch 10f is designed so that a voltage difference between the bit line pair BLT, BLC after the activation of the word line signal WLT becomes almost the same in an H state and in an L state by, for example, the aforementioned kick operation (FIG. 10(c)). Even when the coupling capacitance of the read switch 10f is the same as that of the conventional art, the read margin is improved because the voltage of the bit line BLT increases by the kick operation.

Next, the word line signal WLT is activated, data held in a memory cell MC (in this example, in the H state) is transmitted to the bit line BLT, and the voltage of the bit line BLT increases further. The word line signal WLT is activated and thereafter, the read control signal RDRVTN is changed to the low level before a column selecting signal CSLP is activated (FIG. 10(d)). Thereafter, the column selecting signal CSLP is activated (FIG. 10(e)), and the read data which are complementary to each other are outputted to read data lines RDC, RDT.

Thereafter, the column selecting signal CSLP, the word line signal WLT, and the bit line control signal BTRP are changed, similarly to FIG. 9, so that the read operation is complete.

(B) Write Cycle

First, the bit line control signal BTRP is inactivated (low level) and thereafter, the read control signal RDRVTN corresponding to the bit line BLT to which the write data is transmitted is changed to the high level before the word line signal WLT is activated, similarly to the aforementioned read cycle (kick operation). The voltage of the bit line BLT increases as the read control signal RDRVTN changes (FIG. 10(f)).

The word line signal WLT is activated and thereafter, the read control signal RDRVCN is changed to the high level before the column selecting signal CSLP is activated (FIG. 10(g)). A write control signal WSELP and the column selecting signal CSLP are activated sequentially, the write data which are transmitted to write data lines WDT, WDC are transmitted to the bit lines BLT, BLC via nodes ND01, ND02, and the levels of the bit lines BLT, BLC are inverted (FIG. 10(h)).

Next, the column selecting signal CSLP and the write control signal WSELP are inactivated sequentially (FIG. 10(i)) and the word line signal WLT is inactivated (FIG. 10(j)). Thereafter, the bit line control signal BTRP is activated and the read control signals RDRVTN, RDRVCN are changed to the low levels so that the write operation is complete.

In rewrite operation, timings of the signals to be supplied to the sense amplifier 30 are the same as those in the above-described write operation, except for the column selecting signal CSLP. Waveforms of the bit lines BLT, BLC are the same as those in the read cycle. As a result, it is also possible to improve the read margin of the memory cell MC in the H state in the rewrite operation.

The same effects as those in the aforementioned first and third embodiments can also be obtained in this embodiment.

Figure 11:
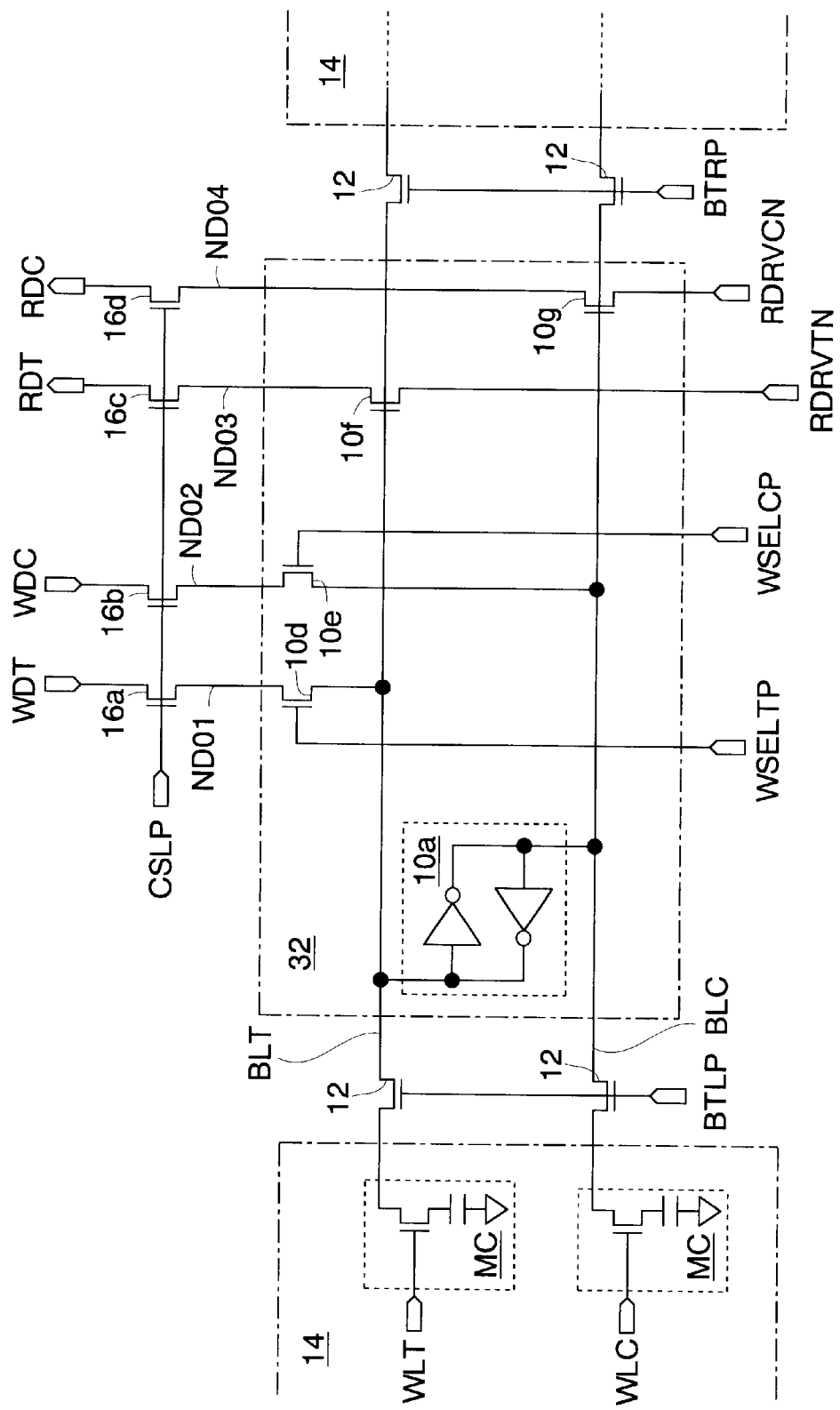
FIG. 11 is a circuit diagram showing a principle part according to a fifth embodiment of the present invention.

FIG. 11 shows a principle part of a read/write control circuit and a memory cell array according to a fifth embodiment of the semiconductor memory and the method of operating the semiconductor memory of the present invention. Incidentally, the same numerals and symbols are given to the same circuits and signals as those explained in the Description of the Related Art and in the first embodiment, and detailed explanations thereof are omitted.

In this embodiment, a sense amplifier 32 has characteristics of both the sense amplifier 28 in the first embodiment (FIG. 5) and the sense amplifier 30 in the third embodiment (FIG. 8). Namely, write switches 10d, 10e of the sense amplifier 32 are controlled by write control signals WSELTP, WSELCP, respectively, and read switches 10f, 10g of the sense amplifier 32 are controlled by read control signals RDRVTN, RDRVCN, respectively. The rest of the structure is the same as that of FIG. 5.

In this embodiment, for example, the read control signal RDRVCN and the write control signal WSELCP are changed to the low levels before a word line WLT is activated, whereby the voltage of a bit line BLC on a reference side is decreased. Alternately, the read control signal RDRVTN and the write control signal WSELTP are changed to the high levels before the word line WLT is activated, whereby the voltage of a bit line BLT on a data side is increased. Therefore, the kick operation is carried out by using both coupling capacitances of the read switch and the write switch. As a result, the layout size of the read switches 10f, 10g and the write switches 10d, 10e can be decreased.

The same effects as those in the aforementioned first and the third embodiments can also be obtained in this embodiment. Further, in this embodiment, the layout size of the read switches 10f, 10g and the write switches 10d, 10e can be minimized to improve the read margin.

Incidentally, in the aforementioned embodiments, the example of transmitting the data to the bit line BLT is explained. However, the present invention is not limited to the above embodiments. It can be securely operated when, for example, the data is transmitted to the bit line BLC. In this case, the waveforms of the write control signals WSELTP, WSELCP in FIG. 6 and FIG. 7 are reversed and the waveforms of the read control signals RDRVTN, RDRVCN in FIG. 9 and FIG. 10 are reversed.

In the aforementioned embodiments, the example of applying the present invention to the read operation in the read cycle and the rewrite operation in the write cycle is explained. However, the present invention is not limited to the above embodiments. The present invention may be applied to, for example, refresh operation.

In the aforementioned embodiments, the example of applying the present invention to the sense amplifier of the DRAM is explained. However, the present invention is not limited to the above embodiments. It can be applied to, for example, other sense amplifiers of the semiconductor memories having the memory cell of the DRAM (for example, SDRAM, FCRAM (Fast Cycle RAM)).

In the aforementioned first and the second embodiments, the example of changing the voltage of the bit line by changing either one of the write control signals WSELTP, WSELCP before the sense amplifier starts the amplification operation is explained. However, the present invention is not limited to the above embodiments. It is suitable to change the write control signals WSELTP, WSELCP to the levels opposite to each other in order to change the voltage of both of the bit lines of the bit line pair. In this case, the voltage difference between the bit line pair can be increased further.

Similarly, in the aforementioned third and fourth embodiments, it is suitable to change the read control signals RDRVTN, RDRVCN to the levels opposite to each other in order to change the voltage of both of the bit lines of the bit line pair.

The invention is not limited to the above embodiments and various modifications may be made without departing from the spirit and the scope of the invention. Any improvement may be made in part or all of the components.

What is claimed is:

1. A semiconductor memory, comprising:
    a bit line connected to a memory cell; and
    a sense amplifier for amplifying data on said bit line, and wherein:
    said sense amplifier includes a transistor for electrically connecting a data bus to said bit line to transmit the data therebetween; and
    said transistor is operated in advance before said data is amplified by said sense amplifier so as to change a voltage of said bit line by a coupling capacitance of said transistor and said bit line.

2. The semiconductor memory according to claim 1, wherein
    said transistor connects one of its source and drain to said data bus and the other of the source and drain to said bit line, respectively, and receives, at its gate, a write control signal which is activated during a write operation.

3. The semiconductor memory according to claim 1, wherein
    said transistor connects its drain to said data bus and its gate to said bit line, and receives, at its source, a read control signal which turns to a source voltage during a read operation.

4. The semiconductor memory according to claim 1, further comprising:

a bit line pair composed of two of said bit lines, wherein;

said data and a reference voltage are respectively supplied to one of said bit lines and the other of said bit lines in accordance with an address signal supplied from an exterior; and one of said transistor for reading and said transistor for writing respectively connected to each of said bit lines of said bit line pair are independently controlled.

5. The semiconductor memory according to claim 4, wherein said transistor connected to said bit line supplied with said reference voltage is operated in advance before amplification so that a voltage of said bit line supplied with said reference voltage becomes lower than a voltage of said bit line supplied with said data.

6. The semiconductor memory according to claim 4, wherein said transistor connected to said bit line supplied with said data is operated in advance before amplification so that a voltage of said bit line supplied with said data becomes higher than a voltage of said bit line supplied with said reference voltage.

7. The semiconductor memory according to claim 1, further comprising:

a column switch for connecting said data bus to said data line for inputting/outputting said data to/from an exterior, and wherein:

said column switch is operated in accordance with a column address signal for selecting said bit line; and said transistor is operated in accordance with a row address signal for selecting a word line controlling said memory cell.

8. A method of operating a semiconductor memory comprising: a bit line connected to a memory cell; a sense amplifier for amplifying data on said bit line; and a transistor formed in said sense amplifier, for electrically connecting a data bus to said bit line to transmit the data therebetween, the method comprising the steps of:

operating said transistor in advance before said data is amplified by said sense amplifier; and changing a voltage of said bit line by a coupling capacitance of said transistor and said bit line.

9. A semiconductor memory, comprising:

a bit line connected to a memory cell;

a word line connected to a memory cell; and a sense amplifier for amplifying data on said bit line, and wherein:

said sense amplifier includes a transistor for electrically connecting a data bus to said bit line to transmit the data therebetween; and said transistor is operated in advance before said data is transmitted from said memory cell to said bit line by selection of said word line, so as to change a voltage of said bit line by a coupling capacitance of said transistor and said bit line.

10. The semiconductor memory according to claim 9, wherein said transistor connects one of its source and drain to said data bus and the other of the source and drain to said bit line, respectively, and receives, at its gate, a write control signal which is activated during a write operation.

11. The semiconductor memory according to claim 9, wherein said transistor connects its drain to said data bus and its gate to said bit line, and receives, at its source, a read control signal which turns to a source voltage during a read operation.

12. The semiconductor memory according to claim 9, further comprising a bit line pair composed of two of said bit lines, wherein:

said data and a reference voltage are respectively supplied to one of said bit lines and the other of said bit lines in accordance with an address signal supplied from an exterior; and one of said transistor for reading and said transistor for writing respectively connected to each of said bit lines of said bit line pair are independently controlled.

13. The semiconductor memory according to claim 12, wherein said transistor connected to said bit line supplied with said reference voltage is operated in advance before amplification so that a voltage of said bit line supplied with said reference voltage becomes lower than a voltage of said bit line supplied with said data.

14. The semiconductor memory according to claim 12, wherein said transistor connected to said bit line supplied with said data is operated in advance before selecting said word line so that a voltage of said bit line supplied with said data becomes higher than a voltage of said bit line supplied with said reference voltage.

15. The semiconductor memory according to claim 9, further comprising:

a column switch for connecting said data bus to said data line for inputting/outputting said data to/from an exterior, and wherein:

said column switch is operated in accordance with a column address signal for selecting said bit line; and said transistor is operated in accordance with a row address signal for selecting said word line controlling said memory cell.

16. A method of operating a semiconductor memory comprising:

a bit line connected to a memory cell;

a word line connected to a memory cell;

a sense amplifier for amplifying data on said bit line; and a transistor formed in said sense amplifier, for electrically connecting a data bus to said bit line to transmit the data therebetween, the method comprising the steps of:

operating said transistor in advance before said data is transmitted from said memory cell to said bit line by selection of said word line; and changing a voltage of said bit line by a coupling capacitance of said transistor and said bit line.

* * * * *